US011681179B2

(12) United States Patent
Kim et al.

(10) Patent No.: US 11,681,179 B2
(45) Date of Patent: *Jun. 20, 2023

(54) POLARIZING PLATE AND OPTICAL DISPLAY DEVICE COMPRISING SAME

(71) Applicant: Samsung SDI Co., Ltd., Yongin-si (KR)

(72) Inventors: Jin Woo Kim, Suwon-si (KR); Han Su Kim, Suwon-si (KR); Kwang Ho Shin, Suwon-si (KR); Dong Yoon Shin, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 250 days.

This patent is subject to a terminal disclaimer.

(21) Appl. No.: 16/470,156

(22) PCT Filed: Nov. 8, 2017

(86) PCT No.: PCT/KR2017/012579
§ 371 (c)(1),
(2) Date: Jun. 14, 2019

(87) PCT Pub. No.: WO2018/117410
PCT Pub. Date: Jun. 28, 2018

(65) Prior Publication Data
US 2019/0353955 A1    Nov. 21, 2019

(30) Foreign Application Priority Data
Dec. 21, 2016  (KR) .................. 10-2016-0176026
Nov. 3, 2017   (KR) .................. 10-2017-0146300

(51) Int. Cl.
*G02F 1/1335*   (2006.01)
*G02B 5/30*     (2006.01)
*G02B 1/14*     (2015.01)

(52) U.S. Cl.
CPC .......... *G02F 1/133528* (2013.01); *G02B 1/14* (2015.01); *G02B 5/3033* (2013.01); *C09K 2323/031* (2020.08)

(58) Field of Classification Search
CPC .................... G02B 1/14; G02B 5/3033; G02F 1/133528; H01L 51/5237; H01L 51/5281; C09K 2323/031
See application file for complete search history.

(56) References Cited

U.S. PATENT DOCUMENTS

| 6,838,185 B2 | 1/2005 | Saiki et al. |
| 11,353,643 B2 * | 6/2022 | Kim ...................... G02B 5/305 |

(Continued)

FOREIGN PATENT DOCUMENTS

| CN | 1831568 A | 9/2006 |
| CN | 101432113 A | 5/2009 |

(Continued)

OTHER PUBLICATIONS

China Office Action in corresponding China Patent Application No. 201780079179.6, China Office Action dated Dec. 3, 2020 (9 pgs.).

(Continued)

*Primary Examiner* — Sophie Hon
(74) *Attorney, Agent, or Firm* — Lewis Roca Rothgerber Christie LLP

(57) ABSTRACT

Provided are a polarizing plate and a display device comprising the same, the polarizing plate comprising: a polarizing film; a polarizing film protection film arranged on at least one surface of the polarizing film; an adhesive layer interposed between the polarizing film and the polarizing film protection film; and a printing layer impregnated in the adhesive layer and formed on at least part of the edge of the adhesive layer, wherein a curve ensuring portion is formed on at least one surface of the printing layer.

15 Claims, 4 Drawing Sheets

(56) References Cited

U.S. PATENT DOCUMENTS

| | | | |
|---|---|---|---|
| 2010/0079718 A1* | 4/2010 | Sekiya | G02F 1/133512 |
| | | | 349/153 |
| 2011/0211136 A1 | 9/2011 | Kubota et al. | |
| 2012/0188638 A1 | 7/2012 | Nakata et al. | |
| 2013/0120242 A1* | 5/2013 | Takakura | G06F 3/0304 |
| | | | 345/156 |
| 2016/0109631 A1 | 4/2016 | Mizutani et al. | |
| 2016/0363795 A1 | 12/2016 | Jeon et al. | |
| 2016/0377914 A1* | 12/2016 | Miyashita | G02F 1/133308 |
| | | | 349/110 |

FOREIGN PATENT DOCUMENTS

| | | | | |
|---|---|---|---|---|
| CN | 102736779 A | | 10/2012 | |
| CN | 103129073 A | | 6/2013 | |
| CN | 103323991 A | * | 9/2013 | ....... G02F 1/133512 |
| CN | 103323991 A | | 9/2013 | |
| CN | 104685552 A | | 6/2015 | |
| CN | 105929476 A | | 9/2016 | |
| CN | 110100195 B | * | 8/2022 | ............... G02B 1/14 |
| JP | 2001-66609 A | | 3/2001 | |
| JP | 2010-79180 A | | 4/2010 | |
| JP | 2011-074308 | | 4/2011 | |
| JP | 2013-254116 A | | 12/2013 | |
| JP | 2013254116 A | * | 12/2013 | |
| JP | 2015-87405 A | | 5/2015 | |
| JP | 2015087405 A | * | 5/2015 | |
| JP | 2016-65928 A | | 4/2016 | |
| JP | 2016-170271 A | | 9/2016 | |
| KR | 10-2013-0050917 A | | 5/2013 | |
| KR | 10-1427473 B1 | | 8/2014 | |
| KR | 10-2015-0007571 A | | 1/2015 | |
| KR | 10-2015-0015243 A | | 2/2015 | |
| KR | 10-2016-0002410 A | | 1/2016 | |
| KR | 20160002410 A | * | 1/2016 | |
| TW | 201322083 A | | 6/2013 | |
| TW | 201337394 A | | 9/2013 | |
| TW | 201432528 A | | 8/2014 | |
| TW | 201502699 A | | 1/2015 | |
| TW | 201623514 A | | 7/2016 | |

OTHER PUBLICATIONS

Taiwan Office Action in corresponding Taiwan Application No. 106140245, Taiwan Office Action dated Feb. 15, 2020 (7 pgs.).
Office action issued in TW 10720266920 dated Mar. 27, 2018, including English summary, 8pp.
Machine Translation of KR 10-2015-0007571 (Year: 2015).
Machine Translation of KR 10-2016-0002410 (Year: 2016).
Machine Translation of JP 2015-087405 (Year: 2015).
China Office Action dated Jan. 20, 2020 in Chinese Patent Application No. 201780007418.7 (9 pgs.).
U.S. Restriction Requirement dated Jul. 30, 2020, issued in U.S. Appl. No. 16/069,866 (9 pages).
U.S. Office Action dated Oct. 16, 2020, issued in U.S. Appl. No. 16/069,866 (15 pages).
U.S. Final Office Action dated Mar. 11, 2021, issued in U.S. Appl. No. 16/069,866 (16 pages).
U.S. Advisory Action dated Jul. 29, 2021, issued in U.S. Appl. No. 16/069,866 (7 pages).
U.S. Notice of Allowance dated Oct. 6, 2021, issued in U.S. Appl. No. 16/069,866 (10 pages).
U.S. Notice of Allowance from U.S. Appl. No. 16/069,866, dated Feb. 7, 2022, 10 pages.

* cited by examiner

[Figure 1]
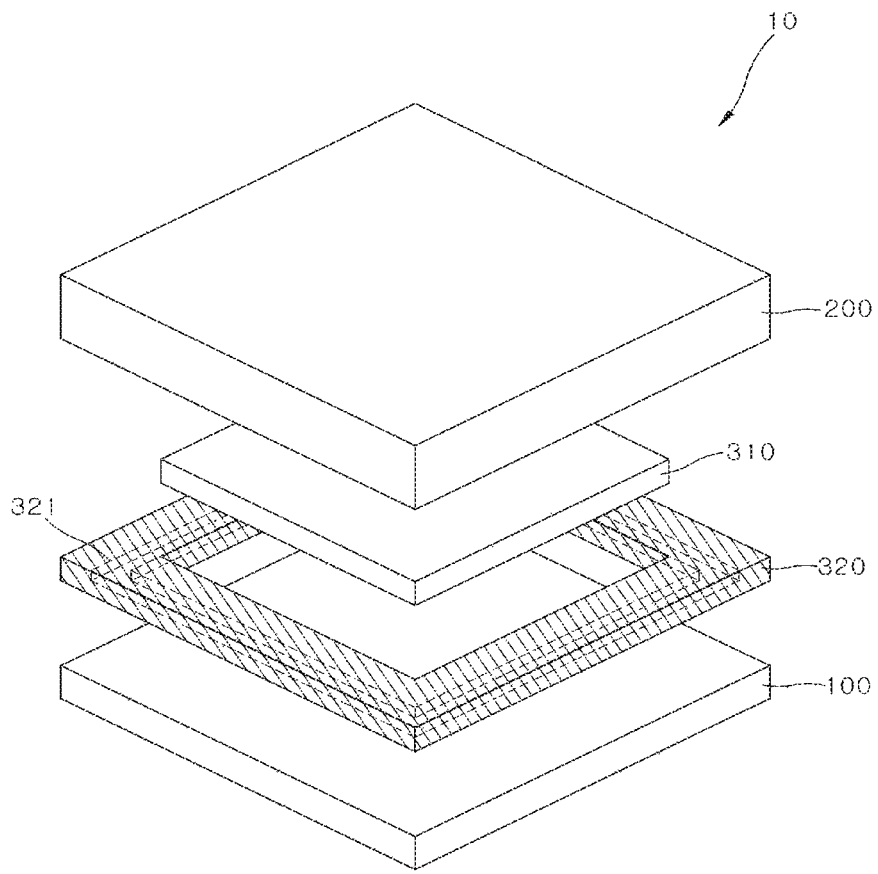
[Figure 2]
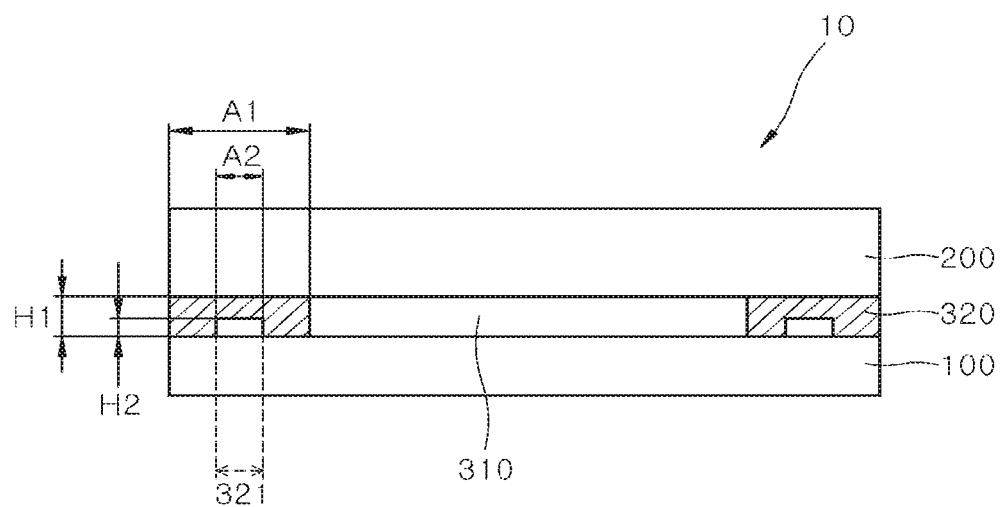

【Figure 3】
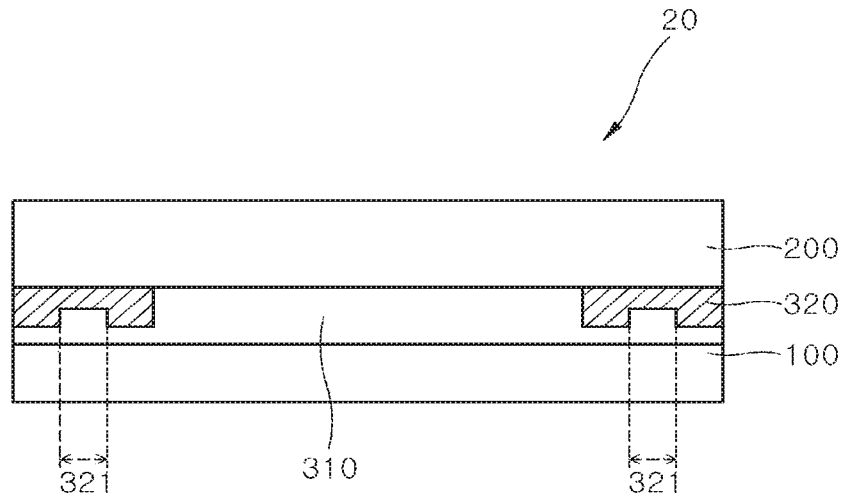
【Figure 4】
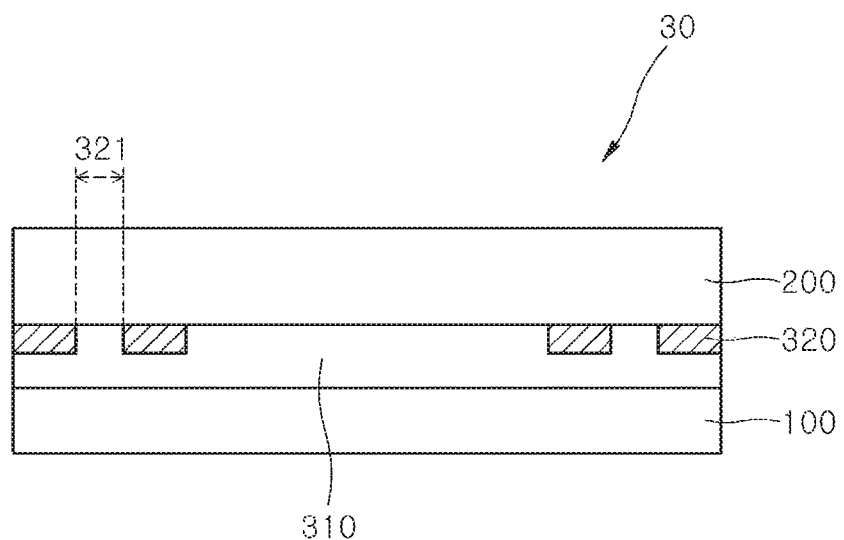

【Figure 5】
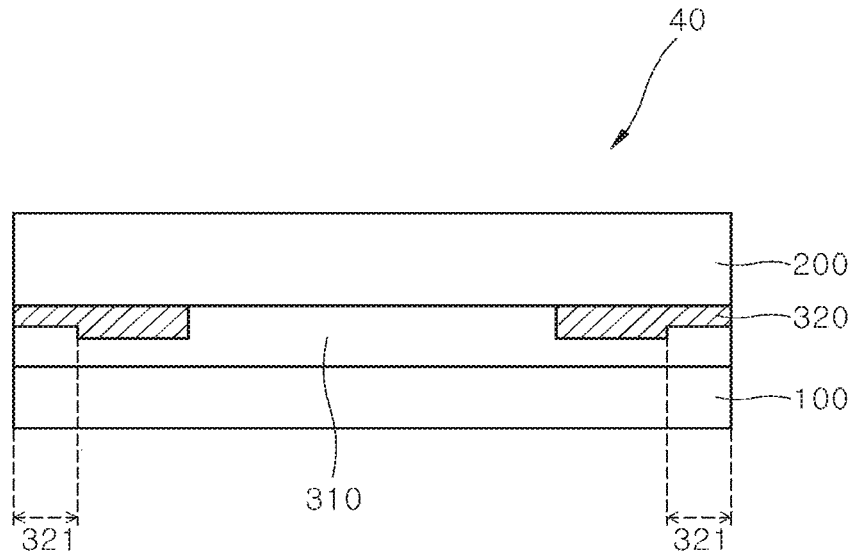
【Figure 6】
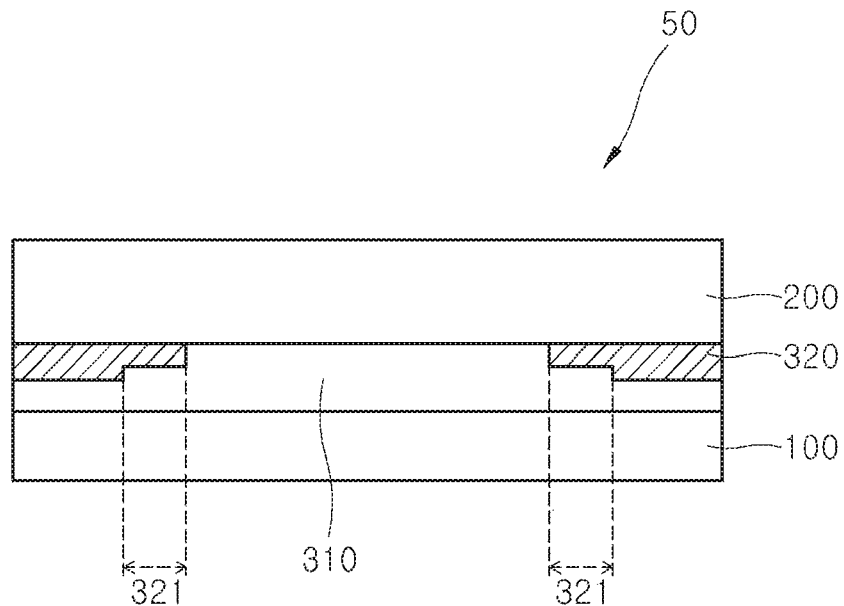

【Figure 7】
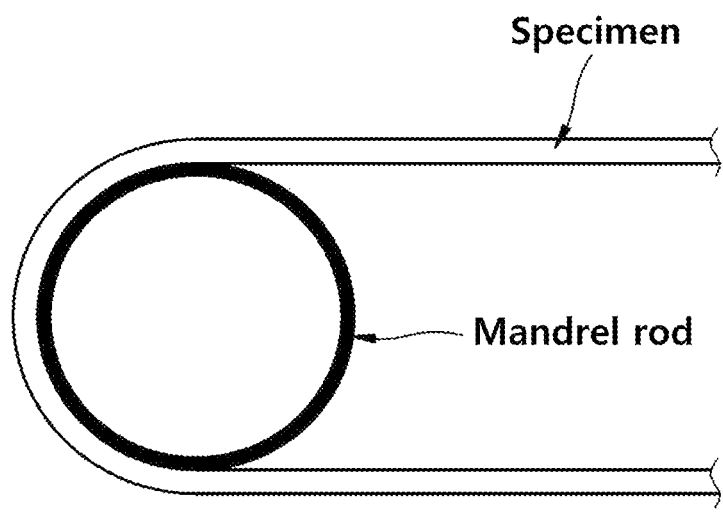

POLARIZING PLATE AND OPTICAL DISPLAY DEVICE COMPRISING SAME

CROSS-REFERENCE TO RELATED APPLICATIONS

This application is a National Phase Patent Application and claims priority to and the benefit of International Application Number PCT/KR2017/012579, filed on Nov. 8, 2017, which claims priority to and the benefit of Korean Patent Application Nos. 10-2016-0176026, filed on Dec. 21, 2016, and 10-2017-0146300, filed on Nov. 3, 2017, the entire contents of all of which are incorporated herein by reference.

FIELD

The present invention relates to a polarizing plate and an optical display including the same.

BACKGROUND

For a liquid crystal display or an organic light emitting display, grayscale of each pixel can be adjusted through optical modulation of transmitted light or self-emission of pixels in response to an input image signal. A layer serving to modify transmitted light or luminance level for each pixel is referred to as a modulation layer. The liquid crystal layer of a liquid crystal display and an organic light emission layer of an organic light emitting display correspond to the modulation layer.

Since the liquid crystal layer is not a light valve that completely blocks light, the liquid crystal display includes two polarizing plates at both sides of the liquid crystal layer in the vertical direction, that is, at a backlight side and a viewing side of a viewer.

In the organic light emitting display, the organic light emission layer does not emit light when voltage is not applied thereto. Hence, the organic light emitting display can realize a completely black color and provide a higher contrast ratio than the liquid crystal display. Thus, the organic light emitting display does not employ a polarizing plate for the purpose of blocking light emission. However, in use of the organic light emitting display, an internal metal wiring can reflect light incident from the outside, thereby causing degradation in contrast ratio of the organic light emitting display. Accordingly, the organic light emitting display may employ a polarizing plate to prevent contrast degradation due to reflection.

Such a display device includes a display region displaying an image and a non-display region surrounding the display region in horizontal cross-sectional view, and a black matrix or a printed layer may be formed in a region overlapping the non-display region in order to prevent internal elements disposed outside the display region from being visible from the outside.

The background technique of the present invention is disclosed in Korean Patent Laid-open Publication No. 2015-0015243.

SUMMARY

It is one object of the present invention to provide a polarizing plate that includes a printed layer to prevent elements in a non-display region from being visible from the outside and allows further reduction in thickness of a display device.

It is another object of the present invention to provide a polarizing plate that can prevent generation of cracks even when applied to a non-display region having a curved distal end.

In accordance with one aspect of the present invention, a polarizing plate includes: a polarizing film; a protective film for polarizing film disposed on at least one surface of the polarizing film; a bonding layer interposed between the polarizing film and the protective film for polarizing film; and a printed layer embedded in the bonding layer and disposed on at least part of an edge of the bonding layer and having a curve securing portion formed on one surface thereof.

In accordance with another aspect of the present invention, there is provided an optical display including the polarizing plate according to the present invention.

The present invention provides a polarizing plate that includes a printed layer to prevent elements in a non-display region from being visible from the outside and can prevent generation of cracks even when applied to a non-display region having a curved distal end.

The present invention provides a polarizing plate that allows further reduction in thickness of a display device.

BRIEF DESCRIPTION OF THE DRAWINGS

FIG. 1 is a perspective view of a polarizing plate according to one embodiment of the present invention.

FIG. 2 is a sectional view of the polarizing plate according to the one embodiment of the present invention.

FIG. 3 is a sectional view of a polarizing plate according to another embodiment of the present invention.

FIG. 4 is a sectional view of a polarizing plate according to a further embodiment of the present invention.

FIG. 5 is a sectional view of a polarizing plate according to yet another embodiment of the present invention.

FIG. 6 is a sectional view of a polarizing plate according to yet another embodiment of the present invention.

FIG. 7 is a conceptual view for evaluation of crack generation upon bending.

DETAILED DESCRIPTION

Embodiments of the present invention will be described in detail with reference to the accompanying drawings to provide thorough understanding of the invention to those skilled in the art. It should be understood that the present invention may be embodied in different ways and is not limited to the following embodiments. In the drawings, portions irrelevant to the description will be omitted for clarity. Like components will be denoted by like reference numerals throughout the specification.

Herein, spatially relative terms such as "upper" and "lower" are defined with reference to the accompanying drawings. Thus, it will be understood that the term "upper surface" can be used interchangeably with the term "lower surface", and when an element such as a layer or a film is referred to as being placed "on" another element, it can be directly placed on the other element, or intervening element(s) may be present. On the other hand, when an element is referred to as being placed "directly on" another element, there are no intervening element(s) therebetween.

An optical display is composed of a display region and a non-display region. The display region corresponds to a portion of the optical display, which serves to display an image, and allows a viewer to view the image through a screen. The non-display region is not directly related to a display function. The non-display region is placed along an edge of the display region and surrounds the display region to protect the display region. A printed circuit board and a driving chip are mounted in the non-display region. The non-display region is shielded by a shielding layer or a printed layer so as not to be viewed by a user of an optical display. Generally, in order to shield the non-display region from being visible from the outside, a printed layer is formed on a cover window or a separate printed tape is attached thereto.

A polarizing plate according to the present invention is formed over the entirety of the display region and the non-display region, and includes a printed layer on the non-display region. With this structure, the polarizing plate according to the present invention can prevent generation of cracks at a curved portion of the non-display region surrounding a curved edge of an optical display. Further, since the printed layer is embedded in a bonding layer, the polarizing plate does not require formation of a separate printed layer on a cover window. Here, according to the present invention, the printed layer is formed of a composition for the printed layer described below, thereby enabling further reduction in thickness of the optical display.

As used herein, the term "embedded" also means that the printed layer is present inside the bonding layer while contacting one surface of the bonding layer.

A polarizing plate according to one embodiment of the present invention includes a polarizing film, a protective film for polarizing film formed on one or both surfaces of the polarizing film, a bonding layer interposed between the polarizing film and the protective film for polarizing film, and a printed layer formed on at least part of an edge of the bonding layer to be embedded in the bonding layer, wherein the printed layer has a curve securing portion formed on at least one surface thereof. In application of the polarizing plate to an optical display, the curve securing portion corresponds to a contact portion between the polarizing plate and a curved edge of the optical display and prevents generation of cracks at a curved portion of the polarizing plate disposed to surround the curved edge of the optical display.

Hereinafter, a polarizing plate according to one embodiment of the present invention will be described with reference to FIGS. 1 and 2. FIG. 1 is a perspective view of a polarizing plate according to one embodiment of the present invention and FIG. 2 is a sectional view of the polarizing plate according to the one embodiment of the present invention.

Referring to FIGS. 1 and 2, a polarizing plate 10 according to one embodiment of the invention includes a polarizing film 100, a protective film for polarizing film 200 disposed on one surface of the polarizing film 100, and a bonding layer 310 and a printed layer 320 interposed between the polarizing film 100 and the protective film for polarizing film 200.

Printed Layer

The printed layer 320 is embedded in the bonding layer 310. Specifically, the printed layer 320 is formed along an edge of the bonding layer 310 and contacts one surface of the bonding layer 310. Referring to FIGS. 1 and 2, the printed layer 320 is formed to surround the edge of the bonding layer 310. The printed layer 320 is not formed as a separate layer from the bonding layer 310 and thus allows reduction in thickness of an optical display.

The printed layer 320 corresponds to a non-display region of the optical display when the polarizing plate is mounted on the optical display.

The printed layer 320 is formed on a light exit surface of the polarizing film 100. Thus, a display function can be realized on a portion of the polarizing plate on which the printed layer 320 is not formed. Alternatively, the printed layer 320 may also be formed on a light incident surface of the polarizing film 100.

Thickness H1 of the printed layer 320 may be less than or equal to the thickness of the bonding layer 310. FIG. 1 shows the structure wherein the printed layer 320 has the same thickness as the bonding layer 310. The thickness H1 of the printed layer 320 may be 50% to 100% the thickness of the bonding layer 310. Within this range of thickness, the printed layer 320 can be embedded in the bonding layer and allows reduction in thickness of the polarizing plate. For example, the printed layer 320 may have a thickness H1 of 0.1 µm to 4 µm, preferably 1.0 µm to 4.0 µm. Within this range of thickness, the printed layer 320 can be embedded in the bonding layer and can secure light shielding while allowing reduction in thickness of the polarizing plate.

The printed layer 320 is directly formed on one surface of the protective film for polarizing film 200. This structure can realize further reduction in thickness of an optical display. Herein, the expression "directly formed" means that there are no intervening layers, such as an adhesive layer, a bonding layer or an adhesive-bonding layer, between the printed layer 320 and the protective film for polarizing film 200.

The printed layer 320 may be disposed between the polarizing film 100 and the protective film for polarizing film 200 such that an inner space of the printed layer is partially open. That is, the printed layer 320 has a closed curve shape and may include a partially vacant area. Accordingly, the inner space of the printed layer 320 can be defined as a vacant space inside the printed layer 320 forming a closed curve. In other words, the printed layer 320 may be disposed in at least part or the entirety of an outer periphery in a horizontal cross-section of the polarizing film 100 and the protective film for polarizing film 200, without being limited thereto.

The printed layer 320 may include a composition described below, which imparts adhesive strength to the printed layer 320, whereby the polarizing film 100 can be coupled to the protective film for polarizing film 200. Thus, even in the case where the bonding layer 310 is not present between the polarizing film 100 and the printed layer 320 and between the protective film for polarizing film 200 and the printed layer 320, the polarizing film 100 can be coupled to the protective film for polarizing film 200.

The printed layer 320 can shield or absorb light and may include a certain mark such as company logo, a dot pattern, and the like. Namely, a certain pattern may be formed on the printed layer 320 to provide an aesthetically pleasing appearance to an optical display.

A curve securing portion 321 is formed on at least one surface of the printed layer 320.

Curve Securing Portion

The curve securing portion 321 is formed on at least one surface of the printed layer 320 and is an engraved pattern having a predetermined cross-section. As described below, the curve securing portion 321 has the same or smaller height than the printed layer 320 and includes a step portion. The curve securing portion 321 allows the polarizing plate to be bent without generating cracks when the polarizing plate is coupled to a curved edge portion of an optical display via the curve securing portion. Thus, when the curved edge portion of the optical display is surrounded by the polarizing plate according to the present invention, the curve securing portion serves to relieve stress to the polarizing plate due to the curved edge of the optical display, thereby preventing generation of cracks at the curved edge portion. Preferably, the curve securing portion 321 is formed on the printed layer 320 at a light exit side of the polarizing film 100.

The curve securing portion 321 is formed within one surface of the printed layer 320. However, the location of the curve securing portion 321 on the printed layer 320 can be changed depending upon a curved edge portion of an optical display to be used.

The curve securing portion 321 is an engraved pattern having a predetermined cross-section. The curve securing portion 321 may have the same or larger cross-section than an edge of an optical display to be coupled to the curve securing portion. Referring to FIG. 1, the curve securing portion 321 is an engraved pattern having a rectangular cross-section. However, the cross-sectional shape of the curve securing portion 321 is not limited thereto and may be an n-gonal shape consisting of n planes (n being an integer of 3 to 5). Alternatively, the curve securing portion 321 may have a cross-sectional shape having a curved shape or a curved surface on at least one surface thereof.

Height H2 of the curve securing portion 321 may range from 50% to 100%, for example, 60% to 100%, the thickness H1 of the printed layer 320. Within this range of height, the curve securing portion can prevent generation of cracks at a curved edge of an optical display by relieving stress to the polarizing plate due to the curved edge. FIG. 1 shows the structure wherein the height H2 of the curve securing portion 321 ranges from 50% or more to less than 100% the height H1 of the printed layer 320. The curve securing portion 321 may have a height H2 of 0.1 μm to 4 μm, for example, 0.1 μm to 2.5 μm, specifically 0.5 μm to 2.0 μm. Within this range of height, the curve securing portion 321 can prevent generation of cracks at the curved edge.

Width A2 of the curve securing portion 321 may range from 30% to 100%, for example, 30% or more to less than 100%, specifically 30% to 80%, the width A1 of the printed layer 320 having the curve securing portion 321 formed thereon. Within this range of width, the curve securing portion 321 can prevent generation of cracks in the printed layer. FIG. 1 shows the structure wherein the width A2 of the curve securing portion 321 ranges from 50% to less than 100% the width A1 of the printed layer 320. The curve securing portion 321 may have a width A2 of 100 μm to 3,000 μm, for example, 500 μm to 1,000 μm. Within this range of width, the curve securing portion 321 can prevent generation of cracks in the printed layer.

The curve securing portion 321 may be formed by a typical method known to those skilled in the art. In one embodiment, the curve securing portion 321 may be formed by coating a composition for the printed layer on one surface of the protective film for polarizing film 200, applying an engraved pattern for the curve securing portion to the composition, and curing the composition. In another embodiment, the curve securing portion 321 may be formed simultaneously with the printed layer by coating the composition for the printed layer 320. Specifically, the curve securing portion 321 may be formed by repeatedly coating the composition for the printed layer on one surface of the protective film for polarizing film 200 such that a step is finally formed thereon. Coating may be performed by gravure coating, spin coating or the like, without being limited thereto.

The composition for the printed layer is a photo-curable composition or a heat-curable composition and may include a pigment, an binder resin, and an initiator. With these components, the composition can form the printed layer 320 so as to have a further reduced thickness. The composition for the printed layer may further include a reactive unsaturated compound. The composition for the printed layer may further include a solvent.

The pigment may include carbon black, a mixed pigment of silver-tin alloys, or a combination thereof. Examples of the carbon black may include carbon graphite, furnace black, acetylene black, and Ketjen black, without being limited thereto. The pigment may be provided in the form of a liquid pigment dispersion, without being limited thereto.

The binder resin may include an acrylic resin, a polyimide resin, a polyurethane resin, or a combination thereof. The acrylic resin may include methacrylic acid/benzyl methacrylate copolymer, methacrylic acid/benzyl methacrylate/styrene copolymer, methacrylic acid/benzyl methacrylate/2-hydroxyethyl methacrylate copolymer, and methacrylic acid/benzyl methacrylate/styrene/2-hydroxyethyl methacrylate copolymer, without being limited thereto. The polyurethane resin may include aliphatic polyurethane, without being limited thereto. The acrylic resin may be acrylic pressure sensitive adhesive resin, without being limited thereto.

The reactive unsaturated compound may be a compound having lower weight average molecular weight than the binder resin, and may include a photo-curable unsaturated composition or a heat-curable unsaturated composition. The reactive unsaturated compound may include ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol tri(meth)acrylate, pentaerythritol tetra(meth)acrylate, dipentaerythritol penta(meth)acrylate, dipentaerythritol hexa(meth)acrylate, bisphenol A epoxy (meth)acrylate, ethylene glycol monomethyl ether (meth)acrylate, trimethylolpropane tri(meth)acrylate, and tris(meth)acryloyloxyethyl phosphate, without being limited thereto.

The initiator may include at least one or more of a photo-curable initiator and a heat-curable initiator.

The photo-curable initiator may include acetophenone compounds, benzophenone compounds, thioxanthone compounds, benzoin compounds, triazine compounds, and morpholine compounds, without being limited thereto.

The heat-curable initiator may include, for example, hydrazide compound such as a 1,3-bis(hydrazinocarbonoethyl-5-isopropyl hydantoin), imidazol compound such as a 1-cyanoethyl-2-phenylimidazol, N-[2-(2-methyl-1-imidazolyl)ethyl]urea, 2,4-diamino-6-[2'-methylimidazolyl-(1')]-ethyl-s-triazin, N,N'-bis[2-methyl-1-imidazolylethyl]urea, N,N'-(2-methyl-1-imidazolylethyl)-adipoamide, 2-phenyl-4-methyl-5-hydroxymethylimidazol, 2-phenyl-4,5-dihydroxymethylimidazol, acid anhydride compound such as tetrahydrophthalic anhydride, ethyleneglycol-bis(anhydrotrimellitate), melamin compound, guanidine compound, dicyanamide compound, modified aliphatic polyamine compound, and the like.

The solvent may include glycol ethers such as ethylene glycol methyl ether, ethylene glycol ethyl ether, propylene glycol methyl ether, and the like; cellosolve acetates such as methyl cellosolve acetate, ethyl cellosolve acetate, diethyl cellosolve acetate, and the like; carbitols such as methyl-ethyl carbitol, diethyl carbitol, diethylene glycol monomethyl ether, diethylene glycol monoethyl ether, diethylene glycol dimethyl ether, diethylene glycol methylethyl ether, diethylene glycol diethyl ether, and the like; and propylene glycol alkyl ether acetates such as propylene glycol methyl ether acetate, propylene glycol propyl ether acetate, and the like, without being limited thereto.

The composition for the printed layer 320 may further include 0.1 wt % to 1 wt % of additives. The additives may include a silane coupling agent to increase adhesive strength between the protective film 200 and the printed layer 320.

In one embodiment, the composition for the printed layer may include 1 wt % to 50 wt % of the pigment (or liquid pigment dispersion), 0.5 wt % to 20 wt % of the binder resin, 0.1 wt % to 10 wt % of the initiator, and the balance of the solvent. Within this range, the composition can secure formation of a printed layer having a thin thickness while providing a good light shielding effect.

In another embodiment, the composition for the printed layer may include 1 wt % to 50 wt % of the pigment (or liquid pigment dispersion), 0.5 wt % to 20 wt % of the binder resin, 1 wt % to 20 wt % of the reactive unsaturated compound, 0.1 wt % to 10 wt % of the initiator, and the balance of the solvent. Within this range, the composition can secure formation of a printed layer having a thin thickness while providing a good light shielding effect.

The printed layer may be formed by curing of the composition for the printed layer, wherein the curing may include photo curing, heat curing, or a combination thereof. The photo curing, heat curing may be performed by a typical method known to those skilled in the art.

Bonding Layer

The bonding layer 310 is interposed between the polarizing film 100 and the protective film for polarizing film 200 to bond the polarizing film 100 to the protective film for polarizing film 200. The bonding layer 310 may be directly formed on each of the polarizing film 100 and the protective film for polarizing film 200.

The bonding layer 310 may be formed on at least one surface of each of the polarizing film 100 and the protective film for polarizing film 200. The polarizing film 100 and the protective film for polarizing film 200 may face each other and have substantially the same area in horizontal cross-sectional view. That is, the polarizing film 100 and the protective film for polarizing film 200 may completely overlap each other in horizontal cross-sectional view. The bonding layer 310 may be formed on at least part of the polarizing film 100 and the protective film for polarizing film 200. More specifically, the bonding layer 310 may be disposed in an island shape only at the center of the polarizing film 100 and the protective film for polarizing film 200 excluding the peripheries thereof.

The bonding layer 310 may be directly formed on the printed layer 320 such that the printed layer 320 can be stably disposed inside the polarizing plate 10.

The bonding layer 310 serves to bond or couple the polarizing film 100 and the protective film for polarizing film 200 to each other, and may include a water-based bonding agent or a UV-curable bonding agent. The water-based bonding agent may include at least one selected from the group consisting of polyvinyl alcohol resins and vinyl acetate resins, or may include a polyvinyl alcohol resin having a hydroxyl group, without being limited thereto. The UV-curable bonding agent may include acrylic, urethane-acrylic, and epoxy bonding agents, without being limited thereto.

When the bonding layer 310 is formed of the water-based bonding agent, the bonding layer 310 may have a thickness of 0.1 μm to 4 μm and when the bonding agent 310 is formed of the UV-curable bonding agent, the bonding layer 310 may have a thickness of 2 μm to 4 μm. When the thickness of the bonding layer falls within this range, a gap generated between the polarizing film 100 and the protective film for polarizing film 200 due to the printed layer 320 can be filled with the bonding layer, thereby improving durability of the polarizing plate. That is, the bonding layer 310 can minimize deviation between a region in which the printed layer 320 is present and a region in which the printed layer 320 is not present between the polarizing film 100 and the protective film for polarizing film 200.

Protective Film for Polarizing Film

The protective film for polarizing film 200 may be formed on one surface of the bonding layer 310 to support the bonding layer 310 and the polarizing film 100.

The protective film for polarizing film 200 may be an optically transparent protective film for polarizing film. For example, the protective film for polarizing film may be formed of at least one selected from among polyesters such as polyethylene terephthalate (PET), polybutylene terephthalate, polyethylene naphthalate, and polybutylene naphthalate, acryl, cellulose esters such as acryl, cyclic olefin polymer (COP), and triacetyl cellulose (TAC) resins, polyvinyl acetate, polyvinyl chloride (PVC), polynorbornene, polycarbonate (PC), polyamide, polyacetal, polyphenylene ether, polyphenylene sulfide, polysulfone, polyether sulfone, polyarylate, and polyimide.

In one embodiment, the protective film for polarizing film may include a polyester material. By way of example, the protective film for polarizing film may be formed of an aromatic polyester material in order to secure crystallinity. For example, the protective film for polarizing film may be formed of polyethylene terephthalate (PET), polyethylene naphthalate (PEN), or a copolymer resin including the same, without being limited thereto. The protective film for polarizing film may have a triple co-extrusion structure including polyethylene terephthalate, polyethylene naphthalate, or a copolymer resin including the same. The polyester film may be formed by performing melt-extrusion of, for example, the aforementioned polyester resin into a film shape, followed by cooling the polyester resin on a casting drum. The protective film for polarizing film 200 is well known in the art and thus description of details thereof will be omitted herein.

The protective film for polarizing film 200 may have a thickness of 30 μm to 120 μm, specifically 20 μm to 80 μm. Within this range of thickness, the protective film for polarizing film can be used for an optical display.

Although not shown in FIGS. 1 and 2, a functional layer may be further formed on the protective film for polarizing film 200. The functional layer may provide at least one function of anti-reflection, low reflection, hard coating, anti-glare, anti-fingerprint, anti-contamination, diffusion, and refraction functions, without being limited thereto.

Polarizing Film

The polarizing film 100 is formed on a lower surface of the bonding layer 310 to polarize light entering the polarizing film.

The polarizing film 100 may include a polarizer. The polarizer may include a typical polarizer known to those skilled in the art. Specifically, the polarizer may include a polyvinyl alcohol-based polarizer obtained by uniaxially stretching a polyvinyl alcohol film, or a polyene-based polarizer obtained by dehydrating a polyvinyl alcohol film. The polarizer may have a thickness of about 5 μm to about 40 μm. Within this range, the polarizer can be used for an optical display.

The polarizing film may further include a protective film for polarizing film formed on one surface (light incident surface) of the polarizer. The protective film for polarizing film may include at least one of the protective film for polarizing films described above.

Although not shown in FIGS. 1 and 2, the polarizing plate may further include an adhesive layer formed on a lower surface of the polarizing film 100. The adhesive layer can attach the polarizing plate to a light emitting device, a liquid crystal panel, or the like. The adhesive layer may be formed of an acrylic, urethane, silicone, or epoxy-based adhesive composition, without being limited thereto.

Next, a polarizing plate according to another embodiment of the present invention will be described with reference to FIG. 3. FIG. 3 is a sectional view of a polarizing plate according to another embodiment of the present invention.

Referring to FIG. 3, a polarizing plate 20 according to this embodiment is substantially the same as the polarizing plate 10 according to the above embodiment except that the printed layer 320 is directly disposed on the protective film for polarizing film 200, does not contact the polarizing film 100, and has a smaller height than the bonding layer 310.

Next, a polarizing plate according to a further embodiment of the present invention will be described with reference to FIG. 4. FIG. 4 is a sectional view of a polarizing plate according to a further embodiment of the present invention.

Referring to FIG. 4, a polarizing plate 30 according to this embodiment is substantially the same as the polarizing plate 10 according to the above embodiment except that the printed layer 320 of the polarizing plate 30 is directly disposed on the protective film for polarizing film 200, does not contact the polarizing film 100 and has a smaller height than the thickness of the bonding layer 310, and the curve securing portion 321 has the same height as the printed layer 320.

Next, a polarizing plate according to yet another embodiment of the present invention will be described with reference to FIG. 5. FIG. 5 is a sectional view of a polarizing plate according to yet another embodiment of the present invention.

Referring to FIG. 5, a polarizing plate 40 according to this embodiment is substantially the same as the polarizing plate 10 according to the above embodiment except that the printed layer 320 of the polarizing plate 40 is directly disposed on the protective film for polarizing film 200, does not contact the polarizing film 100 and has a smaller height than the thickness of the bonding layer 310, and the curve securing portion 321 is formed in an engraved pattern having one surface open towards an outer surface of the printed layer 320.

Next, a polarizing plate according to yet another embodiment of the present invention will be described with reference to FIG. 6. FIG. 6 is a sectional view of a polarizing plate according to yet another embodiment of the present invention.

Referring to FIG. 6, a polarizing plate 50 according to this embodiment is substantially the same as the polarizing plate 10 according to the above embodiment except that the printed layer 320 of the polarizing plate 50 is directly disposed on the protective film for polarizing film 200, does not contact the polarizing film 100 and has a smaller height than the thickness of the bonding layer 310, and the curve securing portion 321 is formed in an engraved pattern having one surface open towards an inner surface of the printed layer 320.

Although not shown separately, the present invention provides a method of manufacturing a polarizing plate, which includes: preparing a protective film for polarizing film and a polarizing film; forming a printed layer having a curve securing portion on an outer periphery of one surface of the protective film for polarizing film; forming a bonding layer by depositing a bonding agent on one surface of the protective film for polarizing film having the printed layer formed thereon; and coupling the polarizing film to the protective film for polarizing film such that the printed layer is interposed between the polarizing film and the protective film for polarizing film. A composition for the printed layer may include a pigment, a binder resin, an initiator, and a solvent. The composition for the printed layer is the same as described above.

The step of preparing a protective film for polarizing film and a polarizing film are partially described above in description of the embodiments of the polarizing plate, and is well known to those skilled in the art. Thus, a detailed description of this step will be omitted.

The step of forming a printed layer may be performed by coating the composition for the printed layer on the outer periphery of one surface of the protective film for polarizing film using a micro gravure printer.

Thereafter, the composition for the printed layer may be cured by photo curing or heat curing, to form the printed layer. Then, the step of forming a bonding layer may be performed by depositing the bonding agent on one surface of the protective film for polarizing film having the printed layer formed thereon. By deposition of the bonding agent, the bonding layer may be formed on at least part of a region in which the printed layer of the protective film for polarizing film is not formed. That is, the bonding layer may be disposed in a space inside the printed layer by depositing the bonding agent. Here, the bonding layer may be formed so as to be placed only between the polarizing film and the protective film for polarizing film.

Thereafter, with the printed layer and the bonding layer embedded therein, the polarizing film may be coupled to the protective film for polarizing film, followed by curing the bonding layer and the printed layer through UV radiation. However, it should be understood that the present invention is not limited thereto. Alternatively, before coupling the polarizing film to the protective film for polarizing film, pre-curing may be performed by irradiating the printed layer and the bonding layer with UV light. Alternatively, after formation of the printed layer, photo curing or heat curing, deposition of the bonding agent to form the bonding layer, coupling between the polarizing film and the protective film for polarizing film, and UV curing may be sequentially performed.

The method may further include forming a separate protective layer on the other surface of the polarizing film via a bonding layer interposed therebetween, or forming a primer layer on the other surface of the polarizing film and forming an adhesive layer on the primer layer. These processes are well known to those skilled in the art and detailed descriptions thereof will be omitted.

Optical Display

Although not shown in the drawings, the present invention provides an optical display including the polarizing plate according to the embodiments of the invention.

The optical display may include a display panel and a polarizing plate disposed on one surface of the display panel. For example, when the optical display is a liquid crystal display, polarizing plates may be disposed on both surfaces of a display panel of the liquid crystal display. In this structure, the polarizing plate according to the present invention may be disposed at a viewer side on the display panel. In addition, the protective film for polarizing film having the printed layer interposed between the protective film for polarizing film and the polarizing film may be disposed at a viewer side on the viewer side polarizing plate. That is, the protective film for polarizing film having the printed layer interposed between the protective film for polarizing film and the polarizing film may be disposed on the outermost side with reference to a viewer, and, since the printed layer is formed on the polarizing plate, the polarizing plate does not require a separate printed layer on a cover window.

When the optical display is a liquid crystal display, a display panel of the optical display may include liquid crystal cells. In this case, the optical display may further include a backlight unit. Since the optical display including the liquid crystal cells is not provided with a self-emissive light source unlike an organic light emitting diode (OLED) panel, the optical display requires a separate backlight unit.

Typically, the liquid crystal cell includes two substrates and a liquid crystal layer interposed between the substrates. In general, a color filter, opposite electrodes, and an alignment layer may be formed on one of the substrates, and a liquid driving electrode, a wiring pattern, a thin film transistor, and an alignment layer may be formed on the other substrate.

The liquid crystal cell may be operated in, for example, a twisted nematic mode or an electrically controlled birefringence mode. The electrically controlled birefringence mode may include a vertical alignment mode, an optically compensated bent (OCB) mode, an in-plane switching (IPS) mode, and the like.

In general, the backlight unit may include a light source, a light guide plate, and a reflective layer. The backlight unit can be classified into a direct type, a side light type, and a surface light type depending upon the structure thereof.

In a structure wherein the display panel is composed of the liquid crystal cells, the polarizing plates may be disposed on both sides of the liquid crystal cells. In this structure, the polarizing plates allow transmission of a light component oscillating in a specific direction among light emitted from the light source of the backlight unit. In a structure wherein the polarizing plates are interposed between the liquid crystal cells, a transmission axis of an upper polarizing plate may be orthogonal or parallel to a transmission axis of a lower polarizing plate.

When the optical display is an organic light emitting display, the polarizing plate may be disposed only at a viewer side of a display panel thereof. When the optical display is an organic light emitting display, the display panel of the optical display may include an organic light emitting diode (OLED) panel. The OLED panel may include pixels, each of which may include an OLED composed of an organic light emitting layer between an anode and a cathode and a pixel circuit independently driving the OLED. The pixel circuit includes a switching thin film transistor (TFT), a capacitor, and a driving TFT. The switching thin film transistor can charge a capacitor with a data voltage in response to a scan pulse, and the driving TFT can control the amount of current supplied to the OLED depending upon the data voltage charged in the capacitor, thereby enabling display of an image through control of the amount of light emission from the OLED. The OLED panel is well known in the art and a detailed description thereof will be omitted.

The polarizing plate disposed at the viewer side of the OLED panel may be the polarizing plate according to the present invention. That is, the polarizing plate according to the present invention may be attached to a side of the OLED panel at which a viewer observes an image displayed on the OLED panel. Accordingly, it is possible to prevent deterioration in contrast due to reflection of external light. Since the polarizing plate includes the printed layer therein, there is no need for a separate printed layer for protection of internal elements on a cover window or a sealing layer of the OLED display including the polarizing plate.

The optical display may include a casing that receives components of the optical display, and a printed circuit board or a touch panel that transfers external signals input from the outside. Further, the optical display may include a cover window that protects internal elements from external impact. Since the polarizing plate according to this invention includes the printed layer, the cover window may not include a separate black matrix, a light shielding layer or a separate printed layer thereon. Details of these components are well known to those skilled in the art and detailed descriptions thereof will be omitted.

Next, the present invention will be described in more detail with reference to some examples. However, it should be noted that these examples are provided for illustration only and are not to be construed in any way as limiting the present invention.

Examples 1 to 5

A black pigment was used as a liquid pigment dispersion (A) containing 30 wt % of a pigment. Specifically, a liquid pigment dispersion (A-1) comprising a silver-tin alloy (TMP-DC-1, Sumitomo Oosaka Cement Co., Ltd.) (solid content: 30%, weight ratio of silver to tin=7:3) and a liquid pigment dispersion (A-2) comprising carbon black (CI-M-050, Sakata Co., Ltd.) were mixed in an amount ratio as listed in Table 1. An aliphatic polyurethane (B-1) (SUO-1000, Shina T&C Co., Ltd.) and acrylic pressure sensitive adhesive resin (WA-9263, Wooin Chem Tech, Co., Ltd.) (B-2) was used as a binder resin (B). A dipentaerythritol hexa-acrylate (Hanong Chemistry Co., Ltd.) was used as a reactive unsaturated compound (C). In addition, photo-curable initiator Irgacure 369 (D-1) and heat-curable initiator melamine curing agent (M60, Wooin Chem Tech, Co., Ltd.) (D-2) was used as an initiator (D), propylene glycol methyl ether acetate was used as a solvent (E), and a silane coupling agent (765W, Tego Co., Ltd.) was used as a silane coupling agent (F).

In each of Examples 1 to 4, a printed layer was formed between a polarizing film and a protective film for polarizing film (triacetylcellulose film) using a composition prepared by mixing the liquid pigment dispersion, the binder resin, the reactive unsaturated compound, the photo-curable initiator, the solvent, and the silane coupling agent in amounts as listed in Table 1. The printed layer was formed by coating the composition on the protective film for polarizing film, removing the solvent at 85° C. for 1 minute, and curing the composition at 650 mJ using a metal halide lamp.

In each of Examples 5, a printed layer was formed between a polarizing film and a protective film for polarizing film (triacetylcellulose film) using a composition prepared by mixing the liquid pigment dispersion, the binder resin, the heat-curable initiator, the solvent, and the silane coupling agent in amounts as listed in Table 1. The printed layer was formed by coating the composition on the protective film for polarizing film, curing the solvent at 85° C. for 2 minute, thereby heat curing the composition.

In formation of polarizing plates, the thickness of each of the printed layers formed in Examples 1 to 5 was adjusted as listed in Table 1 and the curve securing portion was formed as shown in FIG. 3.

Comparative Example 1

A polarizing plate was prepared by the same method as Examples except that the composition and thickness of a printed layer were changed as listed in Table 1.

Comparative Examples 2 and 3

In formation of a polarizing plate, a printed layer was formed by coating a thermosetting resin composition (EFKA@4015, BASF) and removing a solvent from the composition at 85° C. for 1 minute, followed by curing at 40° C. for 48 hours.

Thickness of each of the printed layers formed in Comparative Examples 2 to 3 was set as listed in Table 1.

Crack generation upon bending was evaluated by a mandrel evaluation method in accordance with JIS K5600. Each of the polarizing plates prepared in Examples and Comparative Examples was cut into a rectangular specimen having a size of 150 mm×40 mm (machine direction (MD)×transverse direction (TD)) with reference to the MD and TD of the polarizer. Referring to FIG. 7, the specimen was wound around a mandrel rod having a diameter of 10 mm by an angle of 180° (degrees) such that the protective film for polarizing film of the specimen contacted the mandrel rod, and was left for 5 seconds, followed by evaluation of crack generation in the printed layer. Generation of no cracks was evaluated as good and generation of cracks was evaluated as poor.

TABLE 1

|  | A (wt %) | | B (wt %) | | C | D (wt %) | | E | F | Thickness of printed layer | Presence of curve securing portion |
| --- | --- | --- | --- | --- | --- | --- | --- | --- | --- | --- | --- |
|  | A-1 | A-2 | B-1 | B-2 | (wt %) | D-1 | D-2 | (wt %) | (wt %) | (μm) |  |
| Example 1 | 25 | 20 | 8 | — | 3 | 3 | — | 40 | 1 | 1.0 | Present |
| Example 2 | 15 | 30 | 8 | — | 3 | 3 | — | 40 | 1 | 2.0 | Present |
| Example 3 | 10 | 35 | 8 | — | 3 | 3 | — | 40 | 1 | 3.0 | Present |
| Example 4 | 10 | 35 | 8 | — | 3 | 3 | — | 40 | 1 | 4.0 | Present |
| Example 5 | 25 | 20 | 8 | 3 | — | — | 3 | 40 | 1 | 1.0 | Present |
| Comparative Example 1 | 5 | 40 | 8 | — | 3 | 3 |  | 40 | 1 | 4.0 | Absent |
| Comparative Example 2 | EFKA@4015 (thermosetting resin, BASF) | | | | | | | | | 5.0 | Absent |
| Comparative Example 3 | EFKA@4015 (thermosetting, BASF) | | | | | | | | | 10.0 | Absent |

Experimental Example

The polarizing plates prepared in Examples 1 to 5 and Comparative Examples 1 to 3 were evaluated as to coating appearance, light shielding, adhesion, and crack generation upon bending, and evaluation results are shown in Table 2.

The coating appearance was observed with the naked eye under a three-wavelength lamp. A polarizing plate having a clean coating appearance was rated as good, a polarizing plate having stains not observable with the naked eye was rated as normal, and a polarizing plate having stains observable with the naked eye was rated as poor.

Light shielding was measured with respect to the printed layer of each polarizing plate using a densitometer (TD-904: Gretag Macbeth Company) in accordance with Japanese Industrial Standards (JIS) K7651:1988. In Table 2, a printed layer having an optical density of greater than 4.0 was rated as ○ and a printed layer having an optical density of 4.0 or less was rated as ×.

Adhesion was evaluated as adhesion between the polarizing film and the printed layer and between the polarizing film and the protective film for polarizing film on the basis of a checkboard pattern tape method in accordance with JIS 5600-5-6. In Table 2, a polarizing plate allowing 10% or more of the area of the checkboard pattern to be peeled off was rated as ×, a polarizing plate allowing 5% to less than 10% of the area of the checkboard pattern to be peeled off was rated as Δ, and a polarizing plate allowing less than 5% of the area of the checkboard pattern to be peeled off was rated as ○.

TABLE 2

|  | Coating appearance | Light shielding | Adhesion | Generation of cracks upon bending |
| --- | --- | --- | --- | --- |
| Example 1 | Good | ○ | ○ | Good |
| Example 2 | Normal | ○ | ○ | Good |
| Example 3 | Normal | ○ | ○ | Good |
| Example 4 | Normal | ○ | ○ | Good |
| Example 5 | Good | ○ | ○ | Good |
| Comparative Example 1 | Poor | ○ | x | Poor |
| Comparative Example 2 | Good | ○ | ○ | Poor |
| Comparative Example 3 | Good | ○ | ○ | Poor |

From Table 1, it could be seen that each of the polarizing plates of Examples 1 to 5 had a thinner printed layer than the polarizing plates of Comparative Example 2 and 3. In addition, the polarizing plates of Examples 1 to 5 did not suffer cracking upon bending.

In addition, it could be seen from Table 2 that each of the polarizing plates of Examples 1 to 4 exhibited good properties in terms of coating appearance, light shielding and adhesion while providing a thin thickness.

It should be understood that various modifications, changes, alterations, and equivalent embodiments can be made by those skilled in the art without departing from the spirit and scope of the invention.

The invention claimed is:

1. A polarizing plate comprising:
a polarizing film;
a protective film for polarizing film disposed on at least one surface of the polarizing film;
a bonding layer interposed between the polarizing film and the protective film for polarizing film; and
a printed layer formed on at least part of a first edge of the bonding layer and having a curve securing portion formed on a surface of the printed layer, the first edge of the bonding layer being an outermost edge of the bonding layer facing in a first lateral direction that crosses a thickness direction of the bonding layer, wherein, in a cross-sectional plane extending in the thickness direction, a first portion of the printed layer overlaps and is entirely outside the first edge of the bonding layer in the first lateral direction, and a width of the curve securing portion formed in the first portion of the printed layer is in a range from 30% or more to less than 100% of a width of the first portion of the printed layer, the curve securing portion has a height of 0.1 μm to 4 μm and the curve securing portion has the width of 100 μm to 3000 μm.

2. The polarizing plate according to claim 1, wherein the printed layer is directly disposed on the protective film for polarizing film.

3. The polarizing plate according to claim 2, wherein the curve securing portion is formed on the surface of the printed layer to face the protective film for polarizing film.

4. The polarizing plate according to claim 1, wherein the printed layer has the same or smaller thickness than the bonding layer.

5. The polarizing plate according to claim 1, wherein the curve securing portion is formed in an engraved pattern having a predetermined cross-sectional shape.

6. The polarizing plate according to claim 5, wherein the engraved pattern has an n-gonal shape composed of n planes, or has a curved surface on at least one surface thereof.

7. The polarizing plate according to claim 1, wherein the curve securing portion is formed below one surface of the printed layer.

8. The polarizing plate according to claim 1, wherein the printed layer is formed to contact one surface of the bonding layer while surrounding a periphery of the bonding layer.

9. The polarizing plate according to claim 1, wherein the printed layer is formed of a composition including a pigment, a binder resin, and an initiator.

10. The polarizing plate according to claim 9, wherein the pigment comprises carbon black, a mixed pigment of silver-tin alloys, or a combination thereof.

11. The polarizing plate according to claim 9, wherein the initiator comprises at least one or more of a photo-curable initiator and a heat-curable initiator.

12. The polarizing plate according to claim 9, wherein the composition further including a reactive unsaturated compound.

13. An optical display device comprising the polarizing plate according to claim 1.

14. A polarizing plate comprising:
a polarizing film;
an optically transparent protective film for polarizing film disposed on at least one surface of the polarizing film;
a bonding layer interposed between the polarizing film and the optically transparent protective film for polarizing film; and
a printed layer formed on at least part of a first edge of the bonding layer and having a curve securing portion formed on a surface of the printed layer, the first edge of the bonding layer facing outward in a first lateral direction that crosses a thickness direction of the bonding layer, wherein, in a cross-sectional plane extending in the thickness direction, a first portion of the printed layer overlaps and is entirely outside the first edge of the bonding layer in the first lateral direction, and a width of the curve securing portion formed in the first portion of the printed layer is in a range from 30% or more to less than 100% of a width of the first portion of the printed layer, the curve securing portion has a height of 0.1 μm to 4 μm and the curve securing portion has the width of 100 μm to 3000 μm,
wherein the curve securing portion has the same height as the printed layer so as to expose the optically transparent protective film for polarizing film.

15. A polarizing plate comprising:
a polarizing film;
a protective film for polarizing film disposed on at least one surface of the polarizing film;
a bonding layer interposed between the polarizing film and the protective film for polarizing film; and
a printed layer formed on at least part of a first edge of the bonding layer and having a curve securing portion formed on a surface of the printed layer, the first edge of the bonding layer facing outward in a first lateral direction that crosses a thickness direction of the bonding layer, wherein, in a cross-sectional plane extending in the thickness direction, a first portion of the printed layer overlaps and is entirely outside the first edge of the bonding layer in the first lateral direction, a lengthwise direction of the curve securing portion being the same as that of the first edge, and a width of the curve securing portion formed in the first portion of the printed layer is in a range from 30% or more to less than 100% of a width of the first portion of the printed layer, the curve securing portion has a height of 0.1 μm to 4 μm and the curve securing portion has the width of 100 μm to 3000 μm,
wherein the curve securing portion has an engraved pattern having a side open to an outer surface or an inner surface of the printed layer, the inner surface being adjacent to the edge of the bonding layer along the lateral direction, and the outer surface being distal from the edge of the bonding layer along the lateral direction.

* * * * *